United States Patent
Chen

(10) Patent No.: US 8,592,889 B1
(45) Date of Patent: Nov. 26, 2013

(54) MEMORY STRUCTURE

(75) Inventor: Chin-Fu Chen, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/476,084

(22) Filed: May 21, 2012

(51) Int. Cl.
*H01L 29/788* (2006.01)

(52) U.S. Cl.
USPC 257/321; 257/316; 257/E21.68; 257/E47.001; 257/E29.3

(58) Field of Classification Search
USPC .............. 257/314–326, E29.3–309, E21.68, 257/E47.001; 438/593, 594, 197
See application file for complete search history.

(56) References Cited

U.S. PATENT DOCUMENTS

| 7,452,775 | B2 | 11/2008 | Wong et al. | |
| 2007/0018235 | A1* | 1/2007 | Arai et al. | 257/320 |
| 2009/0117138 | A1* | 5/2009 | Blalock et al. | 424/185.1 |
| 2009/0173985 | A1* | 7/2009 | Lee et al. | 257/315 |
| 2009/0200597 | A1* | 8/2009 | Sakai | 257/320 |
| 2010/0035392 | A1* | 2/2010 | Tsuchiya et al. | 438/197 |
| 2010/0124819 | A1* | 5/2010 | Taniguchi | 438/593 |
| 2010/0255672 | A1* | 10/2010 | Kidokoro | 438/594 |
| 2011/0309530 | A1* | 12/2011 | Shen et al. | 257/788 |
| 2012/0102312 | A1* | 4/2012 | Rothman et al. | 713/2 |

FOREIGN PATENT DOCUMENTS

JP 2001127158 A * 5/2001

* cited by examiner

*Primary Examiner* — Long Pham
(74) *Attorney, Agent, or Firm* — WPAT, PC; Justin King

(57) ABSTRACT

A memory structure includes a substrate, a source region, a drain region, a gate insulating layer, a floating gate and a control gate. The substrate has a surface and a well extended from the surface to the interior of the substrate. The source region and the drain region are formed in the well and a channel region is formed between the source region and the drain region. The gate insulating layer is formed on the surface of the substrate between the source region and the drain region and covers the channel region. The floating gate disposed on the gate insulating layer to store a bit data. The control gate is disposed near lateral sides of the floating gate.

13 Claims, 2 Drawing Sheets

MEMORY STRUCTURE

FIELD OF THE INVENTION

The invention relates in general to a memory structure, and more particularly to a memory structure having a lateral side control gate.

DESCRIPTION OF THE BACKGROUND

Flash memory can retain the stored data even after power to the memory is removed, and allows data erasing and writing functions. With these advantages, the flash memory has been broadly applied in various electronic products. A conventional flash memory is divided into multiple memory blocks and each memory block is constituted by a number of memory cells, and each cell is used to store a bit data. The memory cell has a control gate, a floating gate, a source and a drain. The stored data in the memory cell is determined according to the storage amount of charges in the floating gate.

However, the typical memory cell is fabricated with two stacked polysilicon layers to be the control gate and the floating gate, which needs another polysilicon process in comparison with the manufacturing process of a typical metal-oxide-semiconductor (MOS) transistor of a logic circuit, so that the process is more complicated and the memory cell is hard to integrate with the manufacturing process of the logic circuit and thus must be fabricated separately.

SUMMARY OF THE INVENTION

The invention is directed to a memory structure, wherein the memory structure can be fabricated with the manufacturing process of the transistor of a typical logic circuit, and thus the steps and the time of the manufacturing process are reduced.

According to an aspect of the present invention, a memory structure is provided. The memory structure includes a substrate, a source region, a drain region, a gate insulating layer, a floating gate and a control gate. The substrate has a surface and a well extended from the surface to the interior of the substrate. The source region and the drain region are formed in the well and a channel region is formed between the source region and the drain region. The gate insulating layer is formed on the surface of the substrate between the source region and the drain region and covers the channel region. The floating gate disposed on the gate insulating layer to store a bit data. The control gate is disposed near lateral sides of the floating gate.

The above and other aspects of the invention will become better understood with regard to the following detailed description of the preferred but non-limiting embodiment(s). The following description is made with reference to the accompanying drawings.

DETAILED DESCRIPTION OF THE INVENTION

The difference between the memory of the present embodiment and the conventional non-volatile memory is that the control gate of the present embodiment is not disposed over the floating gate, instead disposed on the lateral sides of the floating gate. Therefore, the gate structure of the memory and the gate structure of a logic circuit can be formed in the same process without making separately. In addition, the conductive plugs passing through the interlayer dielectric layer can be used as the control gates of the memory in the present embodiment, which are fabricated with the manufacturing process of a metal interconnection of a typical logic circuit without making separately, so that the amount of photo masks and the photolithographic process thereof can be reduced. Moreover, the dielectric layer isolating the sidewalls of the floating gate and the control gate laterally according to the present embodiment is different from the silicon oxide/silicon nitride/silicon oxide (ONO) layer of the conventional SONOS memory disposed under the control gate. Since the capacitance (Cno) of the dielectric layer laterally connected to the floating gate is increased when the lateral coupling area is increased, a gate coupling ratio [Cno/(Cno+Ctun)] in comparison with the capacitance (Ctun) of the gate insulating layer is also increased, and thereby increasing the operating speed and efficiency of the memory device.

A number of embodiments are disclosed below for detailed descriptions of the invention only, not for limiting the scope of protection of the invention.

First Embodiment

Figure 1A:
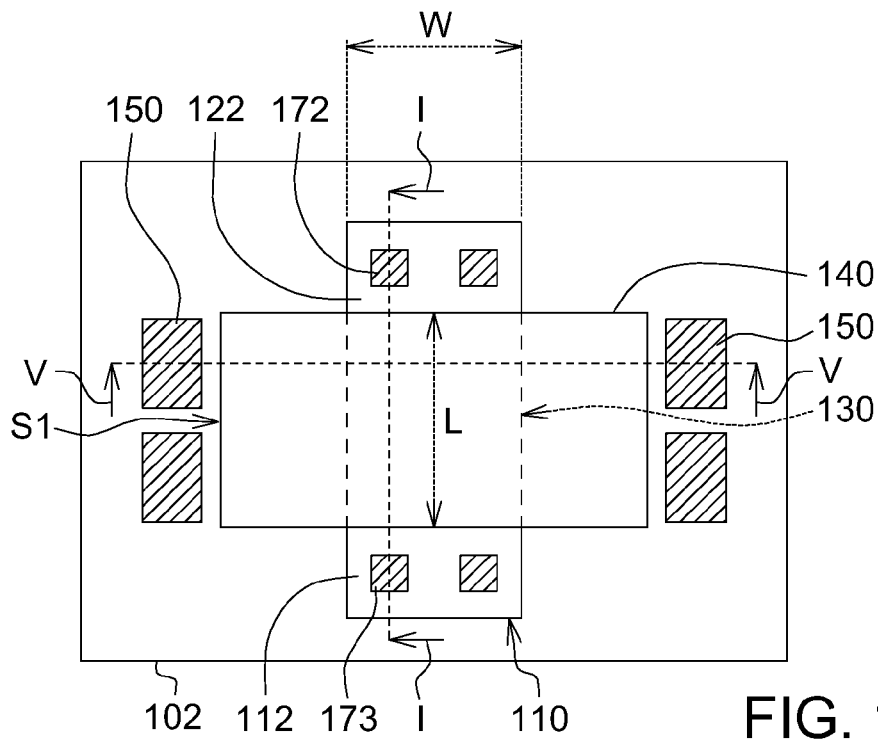
FIGS. 1A-1C are schematic views illustrating a memory structure according to an embodiment of the present invention.
Figure 1B:
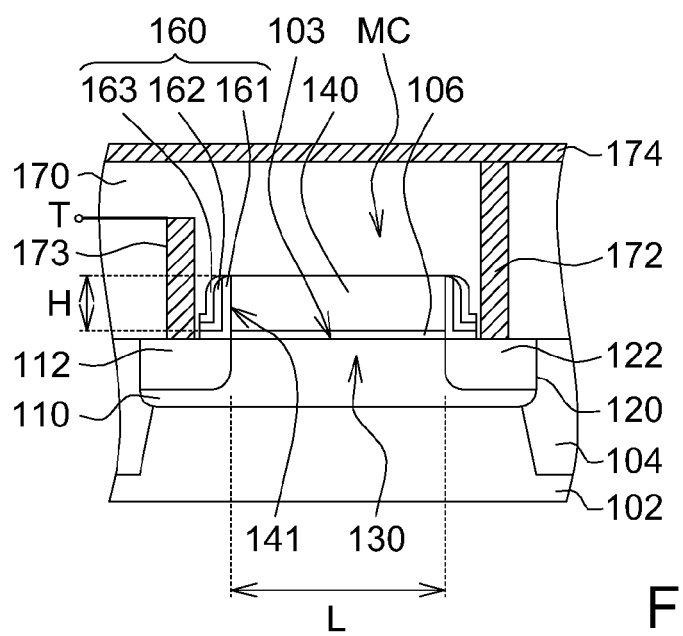
Figure 1C:
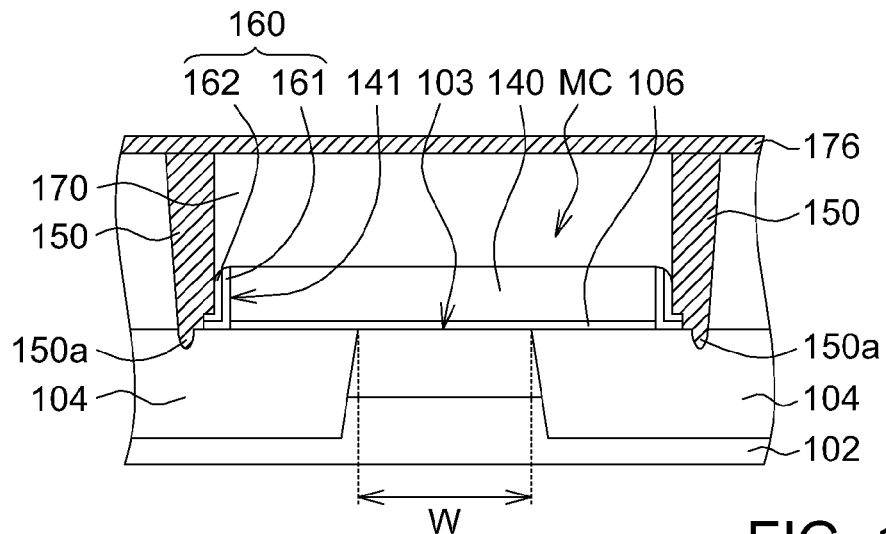

Referring to FIGS. 1A-1C, which are schematic views illustrating a memory structure according to an embodiment of the present invention. The memory structure 100 of the present embodiment is such as a non-volatile flash memory and a typical non-volatile flash memory is a NOR flash or a NAND flash memory. Referring to a top view of a memory structure 100 as shown in FIG. 1A, the memory structure 100 includes a substrate 102, a well 110, a channel region 130, a source region 112, a drain region 122, a floating gate 140 and a control gate 150. The substrate 102 is a p-type silicon substrate 102, for example. The well 110 is extended from a surface 103 of the substrate 102 to the interior of the substrate 102. The well 110 is an n-type well or a p-type well, for example. The source region 112 and the drain region 122 are formed in the well 110 respectively, and a channel region 130 is formed between the source region 112 and the drain region 122. The channel region 130 has a length denoted by L, and a width denoted by W. The area of the channel region 130 is denoted by L×W. According to the process performance of each generation, the width of the channel region 130 has a minimum size up to 1600 angstrom or less to reduce the size of the memory device. The floating gate 140 is disposed on the substrate 102 between the source region 112 and the drain region 122 and covers the channel region 130.

FIG. 1B is a cross-sectional view of a memory structure 100 along I-I line. The source region 112 and the drain region 122 are formed in the well 110 and at the opposite sides of the floating gate 140, respectively. The well 110 is surrounded with an isolation region 104 to define an active region of the memory structure 100. In addition, a gate insulating layer 106 is used to isolate the floating gate 140 and the surface 103 of the substrate 102. The gate insulating layer 106 is a tunnel oxide layer, which is made from silicon oxide, silicon nitride, silicon oxynitride, metal oxide or a dielectric material with high permittivity. The floating gate 140 is made from doped polysilicon, silicon-germanium material, conductive metal or a material having charge storage function. The width of gate insulating layer 106 ranges from tens to hundreds angstrom, for example, so that the carrier can inject into the floating gate 140 from the substrate 102 and be stored in the floating gate 140. The threshold voltage of the floating gate 140 depends on the storage amount of charges in the floating gate 140.

In the FIG. 1B, the memory cell MC is constituted by the floating gate 140, the dielectric layer 160 above the substrate 102 and the source region 112 and the drain region 122 in the substrate 102, which is similar to the structure of metal-oxide-semiconductor transistor in the conventional art, so that the memory cell MC can be fabricated with the manufacturing process of a transistor of a typical logic circuit to reduce the steps and time of the manufacturing process.

In addition, after forming the interlayer dielectric layer 170 on the substrate 102, a bit line 174 is formed on the interlayer dielectric layer 170 in sequence, and the bit line 174 is electrically connected to the drain region 122 via a conductive plug 172 passing through the interlayer dielectric layer 170 to output a bit data stored in the floating gate 140. Further, a control terminal T is electrically connected to the source region 112 via another conductive plug 173 to control a bias applied to the source region 112.

When the storage amount of the electrons in the floating gate 140 is high, the threshold voltage is relatively high and the voltage applied to the control gate 150, more than 6 volts, must be higher than the threshold voltage to open the channel between the source region 112 and the drain region 122 of the memory cell MC. The memory cell MC is defined as being programming state in the time.

When the storage amount of the electrons in the floating gate 140 is low, the threshold voltage of the floating gate 140 is relatively low and the voltage applied to the control gate 150 in order to open the channel 130 between the source region 112 and the drain region 122 of the memory cell MC is lower, for example, lower than 4 volts. The memory cell MC is defined as being erased state in the time.

FIG. 10 is a cross-section view of the memory structure 100 along V-V line, wherein the dielectric layer 160 is formed on the sidewalls 141 of the floating gate 140 to isolate the control gate 150 from the floating gate 140. The dielectric layer 160 includes a first dielectric layer 161 and a second dielectric layer 162 stacked on the first dielectric layer 161. The first dielectric layer 161 is in contact with the sidewalls 141 of the floating gate 140, and the second dielectric layer 162 is in contact with the control gate. The first dielectric layer 161 is made from silicon oxide, and has a thickness about 250 angstrom. The second dielectric layer 162 is made from silicon nitride, and has a thickness about 200 angstrom. Noted that, the dielectric layer 160 as shown in the FIG. 1B has three dielectric layers, namely ONO layers of a conventional SONOS transistor, and the most outer dielectric layer 163 is a silicon oxide layer. However, the most outer dielectric layer 163 is etched when fabricating the control gate 150 such that the dielectric layer 160 becomes two dielectric layers, namely the first dielectric layer 161 and the second dielectric layer 162. Therefore, the control gate 150 in the FIG. 10 can contact the second dielectric layer 162 directly.

In addition, the conventional ONO dielectric layers are disposed over the floating gate 140, while the dielectric layer 160 of the present embodiment is connected to the lateral sides S1 of the floating gate 140, and the lateral coupling area (A) is 2 times of the height (H) of the dielectric layer 160 multiplied by the length (L) of the channel region 130, i.e. 2H×L. According to the capacitance formula, $Cno = dielectric\ constant \times A/Tno$, wherein the capacitance (Cno) of the dielectric layer 160 is direct proportion to the coupling area (A), and is inverse proportion to the thickness (Tno) of the dielectric layer. Therefore, the capacitance (Cno) of the dielectric layer 160 is increased when the coupling area (A) is increased, and the ratio $[Cno/(Cno+Ctun)]$ in comparison with the capacitance (Ctun) of the gate insulating layer 106 is also increased, so that the gate coupling ratio (GCR) is enhanced.

Further, as shown in the FIG. 10, the control gate 150 is formed near the lateral sides S1 of the floating gate 140 to provide an operating voltage for changing a bias voltage of the floating gate 140. The control gate 150 is a conductive plug passing through the interlayer dielectric layer 170 and contacting the dielectric layer 160, for example. Since the control gate 150 (conductive plug) can be fabricated with the manufacturing process of a metal interconnection of a typical logic circuit without making separately, and thereby reducing the process and time of the manufacturing process. In an embodiment, the control gate (conductive plug) 150 has a bottom 150a plugged into an isolation region 104 from the interlayer dielectric layer 170. The isolation region 104 is formed in the substrate 102 by local oxidation of silicon (LOCOS) or shallow trench isolation (STI), and the isolation region 104 is extended from the surface 103 of the substrate 102 downward and surrounding the periphery of the well 110 to define an active region.

In addition, in the FIG. 1C, after forming the control gate 150 passing through the interlayer dielectric layer 170, a word line 176 is formed on the interlayer dielectric layer 170 in sequence, and the word line 176 is electrically connected to the control gate 150 to control the bias voltage of the floating gate 140. The word line 176 and the control gate 150 can be formed by a chemical vapor deposition method and a planar process, which are similar to the metal interconnection process of a typical memory. The details are not repeated herein. In an embodiment, the control gate 150 is made from metal, such as tungsten.

Second Embodiment

Figure 2:
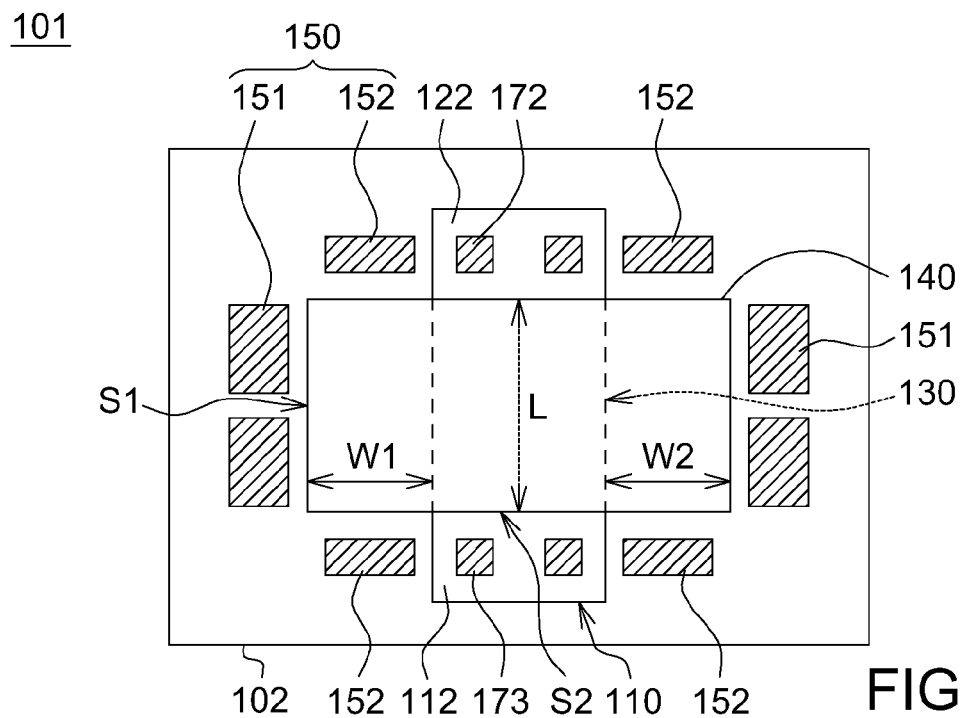
FIG. 2 is a schematic view illustrating a memory structure according to an embodiment of the present invention.

Referring to FIG. 2, which is a schematic view illustrating a memory structure 100 according to an embodiment of the present invention. The difference between the present embodiment and the first embodiment is that the control gate 150 of the memory structure 100 in addition to be disposed on the opposite sides 51 of the floating gate 140, the control gate 150 is disposed on two neighboring sides 51 and S2 of the floating gate 140 to increase the coupling area between the control gate 150 and the floating gate 140. As shown in FIG. 2, the floating gate 140 has two first sides 51 and two second sides S2, which are connected to each other. The control gate 150, for example, has a pair of first control gates 151 corresponding to each of the first sides 51, and a pair of second control gates 152 corresponding to each of the second sides S2. In an embodiment, the second control gates 152 are disposed on the opposite sides of the source region 112 and the drain region 122, respectively, and the number of the second control gate 152 is 4, for example. In addition, the first control gates 151 and the second control gates 152 are disposed in a ring form around the floating gate 140, and the total number is 6-8, for example, but not limited herein.

The first side S1 has a length denoted by L. The second side S2 has two widths on the opposite sides of the source region 112 denoted by W1 and W2, and has two widths on the opposite sides of the drain region 122 denoted by W1 and W2. The dielectric layer 160 in the FIG. 1B is used to isolate the sidewalls 141 of the floating gate 140 from the control gate 150, and has a lateral coupling area (A1), which is denoted as $A1 = 2H \times (L+W1+W2)$. Compared to the dielectric layer of the first embodiment, A1 is larger than A. Therefore, the capacitance (Cno) of the dielectric layer 160 is increased when the coupling area (A1) is increased, and the ratio [Cno/(Cno+Ctun)] in comparison with the capacitance (Ctun) of the gate insulating layer 106 is also increased, so that the gate coupling ratio (GCR) is enhanced.

The operation models including the programming, the erasing and the reading operation of the non-volatile memory are illustrated at below. When the memory cell MC is performing a programming operation, a bias voltage (Vgp), for example, −10 volts is applied to the control gate 150. A bias voltage, for example, 6 volts is applied to the source region 112 and the drain region 122. Under these types of bias voltages, the channel F-N tunneling effect can be used to inject electrons into the floating gate 140 to program the memory cell MC. To read the data in the memory cell MC, a bias voltage (Vgr), for example, 3.3 volts is applied to the control gate 150. The drain region 122 is applied with about 0 volt, while a bias voltage (Vsr), for example, about 1.65 volts is applied to the source region 112. In this case, the channel of the memory cell MC having charges being stored in the floating gate 140 is closed and there is no current flow, or the channel of the memory cell MC having no charges being stored in the floating gate 140 is opened and the current flow is large, so that the bit data stored in the memory cell MC being [1] or [0] can be determined by the opening or closing/the amount of current flow at the channel of the memory cell MC. In addition, the present embodiment is not limited to conduct reading operation in term of a single memory cell MC, the reading operation can also be conducted with a unit of byte, sector or block.

To erase the data in the memory cell MC, a bias voltage, for example, 10 volts is applied to the control gate 150, while the drain region 122 is set floating. A bias voltage, for example, −6 volts is applied to the source region 112, while a bias voltage, for example, −10 volts is applied to the substrate 102. In this case, since the voltage applied between the control gate 150 and the substrate 102 is sufficient to establish a large electric field between the control gate 150 and the substrate 102, the channel F-N tunneling effect can be used to expel the electrons from the floating gate 140 and to remove the electrons by injecting the electrons into the substrate 102. The erasure operation can be conducted with a unit of sector or block by controlling the word line 176 and the bit line 174.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a substrate having a surface and a well extended downward from the surface;
   a source region and a drain region formed in the substrate respectively, and a channel region formed between the source region and the drain region;
   a gate insulating layer formed on the surface of the substrate between the source region and the drain region and covering the channel region;
   a floating gate disposed on the gate insulating layer to store a bit data;
   a control gate disposed near lateral sides of the floating gate;
   a dielectric layer formed on sidewalls of the floating gate and separating the control gate from the floating gate; and
   an interlayer dielectric layer covering the surface of the substrate and the floating gate, wherein the control gate penetrates through the interlayer dielectric layer which covers the floating in gate and contacts the dielectric layer.

2. The memory structure according to claim 1, wherein the dielectric layer comprises a first dielectric layer and a second dielectric layer stacked to the first dielectric layer, the first dielectric layer is in contact with the sidewalls of the floating gate, and the second dielectric layer is in contact with the control gate.

3. The memory structure according to claim 2, wherein the first dielectric layer is made from silicon oxide, and the second dielectric layer is made from silicon nitride.

4. The memory structure according to claim 1, wherein the interlayer dielectric layer is made from silicon oxide.

5. The memory structure according to claim 1, wherein the substrate has an isolation region extended downward from the surface of the substrate and surrounding a periphery of the well.

6. The memory structure according to claim 5, wherein the control gate is a conductive plug and a bottom of the conductive plug is plugged into the isolation region from the interlayer dielectric layer.

7. The memory structure according to claim 1, further comprising:
   a word line formed on the interlayer dielectric layer and electrically connected to the control gate; and
   a bit line formed on the interlayer dielectric layer and electrically connected to the drain region.

8. The memory structure according to claim 1, wherein the floating gate is made from doped polysilicon, silicon-germanium material or a conductive metal, and the control gate is made from metal.

9. The memory structure according to claim 1, wherein the gate insulating layer is a tunnel oxide layer, which is made from silicon oxide, silicon nitride, silicon oxynitride or metal oxide.

10. The memory structure according to claim 1, wherein the control gate is disposed near two opposite sides and/or two neighboring sides of the floating gate.

11. The memory structure according to claim 1, wherein the floating gate has a first side and a second side connected to each other, and the control gate includes at least one first control gate corresponding to the first side and at least one second control gate corresponding to the second side.

12. The memory structure according to claim 11, wherein a plurality of the second control gates are formed at two opposite sides of the source region and two opposite sides of the drain region, respectively.

13. The memory structure according to claim 11, wherein a plurality of the first control gates and the second control gates are disposed in a ring form around the floating gate.

* * * * *